US010403478B2

(12) United States Patent
Yanai et al.

(10) Patent No.: US 10,403,478 B2
(45) Date of Patent: Sep. 3, 2019

(54) PLASMA PROCESSING APPARATUS AND METHOD OF MANUFACTURING SEMICONDUCTOR DEVICE (71) Applicant: HITACHI KOKUSAI ELECTRIC INC., Tokyo (JP)

(72) Inventors: Hidehiro Yanai, Toyama (JP); Shin Hiyama, Toyama (JP); Toshiya Shimada, Toyama (JP); Yukinori Aburatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 558 days.

(21) Appl. No.: 14/838,682

(22) Filed: Aug. 28, 2015

(65) Prior Publication Data
US 2015/0371832 A1 Dec. 24, 2015

Related U.S. Application Data (63) Continuation of application No. PCT/JP2014/058865, filed on Mar. 27, 2014.

(51) Int. Cl.
C23C 16/00 (2006.01)
H01L 21/306 (2006.01)
H01J 37/32 (2006.01)
B08B 7/00 (2006.01)
H01L 21/02 (2006.01)
(Continued)

(52) U.S. Cl.
CPC ...... H01J 37/32522 (2013.01); B08B 7/0035 (2013.01); H01J 37/321 (2013.01);
(Continued)

(58) Field of Classification Search
CPC ............. H01J 37/321; H01J 37/3211; H01J 37/32119; H01J 37/32128;
(Continued)

(56) References Cited

U.S. PATENT DOCUMENTS 5,314,541 A * 5/1994 Saito ............... C23C 14/566
118/50
5,681,418 A * 10/1997 Ishimaru ............ H01J 37/321
118/723 IR
(Continued)

FOREIGN PATENT DOCUMENTS

JP 64-036021 A 2/1989
JP 11-340149 A 12/1999
(Continued)

OTHER PUBLICATIONS

International Search Report, PCT/JP2014/058865, dated Jul. 1, 2014, 3 pgs.
(Continued)

Primary Examiner — Luz L Alejandro Mulero
(74) Attorney, Agent, or Firm — Volpe and Koenig, P.C.

(57) ABSTRACT

The present invention increases uniformity of plasma processing in a surface to be processed of an object to be processed or increases uniformity of plasma processing between objects to be processed. There is provided a plasma processing apparatus including: a processing container; a gas supply system; an exhaust system; a plasma generating unit; a gas flow path installed between an outer wall of the processing container and the plasma generating unit, the gas flow path guiding a temperature controlling gas to flow along the outer wall of the processing container; a plurality of gas introduction holes disposed along a circumferential direction of the processing container and configured to introduce the temperature controlling gas into the gas flow path; and a gas exhaustion hole configured to exhaust the temperature controlling gas passed through the gas flow path.

10 Claims, 5 Drawing Sheets (51) Int. Cl.
*H01L 21/3065* (2006.01)
*H01L 21/67* (2006.01)
*H01L 21/311* (2006.01)

(52) U.S. Cl.
CPC ..... *H01J 37/3211* (2013.01); *H01J 37/32449* (2013.01); *H01J 37/32834* (2013.01); *H01L 21/02041* (2013.01); *H01L 21/02233* (2013.01); *H01L 21/02247* (2013.01); *H01L 21/02249* (2013.01); *H01L 21/3065* (2013.01); *H01L 21/67028* (2013.01); *H01L 21/67069* (2013.01); *H01J 2237/334* (2013.01); *H01J 2237/335* (2013.01); *H01J 2237/338* (2013.01); *H01J 2237/3387* (2013.01); *H01L 21/31138* (2013.01)

(58) Field of Classification Search
CPC ........... H01J 37/32137; H01J 37/32146; H01J 37/32155; H01J 37/32165; H01J 37/32174; H01J 37/32183
USPC .................. 118/723 I, 723 IR, 723 AN, 724; 156/345.48, 345.49, 345.27, 345.37; 315/111.51
See application file for complete search history.

(56) References Cited

U.S. PATENT DOCUMENTS

| | | | | |
|---|---|---|---|---|
| 5,792,261 | A * | 8/1998 | Hama | ................ C23C 16/4404 118/723 I |
| 2003/0062128 | A1 | 4/2003 | Denpoh | |
| 2008/0003362 | A1 * | 1/2008 | Nodera | ............... C23C 16/4404 427/255.28 |
| 2008/0085377 | A1 | 4/2008 | Yamazaki et al. | |
| 2009/0136683 | A1 | 5/2009 | Fukasawa et al. | |
| 2009/0194264 | A1 | 8/2009 | Sasaki | |
| 2010/0278999 | A1 | 11/2010 | Onodera et al. | |
| 2011/0008550 | A1 * | 1/2011 | Murata | ................ C23C 16/403 427/569 |
| 2011/0303152 | A1 | 12/2011 | Asari et al. | |
| 2012/0261587 | A1 * | 10/2012 | Kellogg | ................ H01J 27/16 250/396 R |

FOREIGN PATENT DOCUMENTS

| | | |
|---|---|---|
| JP | 2002-164298 A | 6/2002 |
| JP | 2004-063663 A | 2/2004 |
| JP | 2009-188162 A | 8/2009 |
| JP | 2012-004246 A | 1/2012 |
| TW | 2011-26603 A | 8/2011 |

OTHER PUBLICATIONS

Taiwanese Office Action, Taiwan Patent Application No. 103106771, dated Dec. 11, 2014, 12 pgs total (4 pgs in English Language; 8 pgs in Taiwanese Language).

Japanese Office Action dated Nov. 8, 2016 in the Japanese Application No. 2013-040652.

* cited by examiner

PLASMA PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of International Application No. PCT/JP2014/058865, filed on Mar. 27, 2014, in the WIPO, the whole contents of which are hereby incorporated by reference.

BACKGROUND OF THE INVENTION

1. Field of the Invention

The present invention relates to a plasma processing apparatus and a method of manufacturing a semiconductor device.

2. Description of the Related Art

In the course of manufacturing a semiconductor device, a substrate processing apparatus configured to perform plasma processing on an object to be processed (for example, a wafer) is used in some cases. In a processing container of the substrate processing apparatus, plasma of a processing gas is generated, and plasma processing is performed on the object to be processed. A batch process in which a plurality of objects to be processed are transferred in the substrate processing apparatus and plasma processing is sequentially performed on the transferred objects to be processed is performed.

However, uniformity of plasma processing is low in a surface to be processed of an object to be processed in some cases. Also, uniformity of plasma processing between objects to be processed is low in some cases. Therefore, the present invention provides a plasma processing apparatus and a method of manufacturing a semiconductor device through which uniformity of plasma processing in the surface to be processed of the object to be processed can increase or uniformity of plasma processing between objects to be processed can increase.

SUMMARY OF THE INVENTION

According to an aspect of the present invention, there is provided a plasma processing apparatus including: a processing container configured to accommodate an object to be processed; a gas supply system configured to supply a processing gas into the processing container; an exhaust system configured to exhaust an inside atmosphere of the processing container; a plasma generating unit installed outside the processing container and configured to generate a plasma of the processing gas supplied into the processing container; a gas flow path installed between an outer wall of the processing container and the plasma generating unit, the gas flow path guiding a temperature controlling gas to flow along the outer wall of the processing container; a plurality of gas introduction holes disposed along a circumferential direction of the processing container and configured to introduce the temperature controlling gas into the gas flow path; and a gas exhaustion hole configured to exhaust the temperature controlling gas passed through the gas flow path.

DETAILED DESCRIPTION OF THE PREFERRED EMBODIMENTS

<Knowledge Obtained by the Inventors>

First, knowledge obtained by the inventors will be described. In the course of manufacturing a semiconductor device, a semiconductor manufacturing apparatus (substrate processing apparatus) configured to perform plasma processing on an object to be processed is used. Examples of the semiconductor manufacturing apparatus include a plasma processing apparatus. The plasma processing apparatus generates plasma of a processing gas in a processing container and performs plasma processing on an object to be processed. A batch process in which a plurality of objects to be processed are transferred in the plasma processing apparatus and plasma processing is sequentially performed on the transferred objects to be processed is performed.

The term "plasma processing" used herein refers to ashing of a resist film formed on an object to be processed, etching of a metal film or a semiconductor film formed on the object to be processed, or oxidation, nitridation or ashing of a metal film or a semiconductor film formed on the object to be processed.

The inventors have found that a rate of plasma processing or a degree of plasma processing on the object to be processed in the plasma processing apparatus depends on a temperature of the processing container. The term "a rate of plasma processing" used herein refers to a rate of, for example, ashing, etching, oxidation or nitridation. Also, the term "a degree of plasma processing" refers to a degree (such as a concentration or a depth) of, for example, oxidation or nitridation.

When a temperature of the processing container or a temperature of a coil installed to surround the processing container is nonuniform in a circumferential direction, a temperature distribution of the object to be processed itself is non-uniformized in a planar direction in some cases. Also, a plasma density of a plasma generating region is non-uniformized in the planar direction of the object to be processed in some cases. A rate of plasma processing near a region at which a temperature of the processing container is low is lower than a rate of plasma processing near a region at which a temperature of the processing container is high. Also, a degree of plasma processing near a region at which a temperature of the processing container is low is lower than a degree of plasma processing near a region at which a temperature of the processing container is high. Therefore, uniformity of plasma processing in a surface to be processed of the objects to be processed is likely to decrease.

Also, there is a concern about an increasing temperature of the processing container over time when plasma processing is performed. For example, when plasma processing is performed on one object to be processed, a temperature of the processing container when the processing ends is higher than a temperature of the processing container when the processing starts. Also, when plasma processing is consecutively performed on the plurality of objects to be processed, a temperature of the processing container when processing is performed on the plurality of objects to be processed is higher than a temperature of the processing container when processing is performed on a first object to be processed. In this case, a temperature of the object to be processed itself may be changed over time or a plasma density of the plasma generating region may be changed over time. Accordingly, a rate of plasma processing or a degree of plasma processing is changed over time during processing or for each processing. Therefore, uniformity of plasma processing between the objects to be processed is likely to decrease.

Therefore, the present inventors have conducted research on methods of addressing the above problems and have found the following knowledge.

A gas flow path of a temperature controlling gas is installed along an outer wall of the processing container between the processing container and a plasma generating unit. In the gas flow path, a gas introduction hole and a gas exhaustion hole are installed. The gas introduction holes are disposed in a circumferential direction of the processing container at equal intervals. The temperature controlling gas is uniformly introduced in the circumferential direction of the processing container through the gas introduction hole. The processing container is uniformly cooled in the circumferential direction due to the temperature controlling gas. The temperature of the processing container is uniformized in the circumferential direction. Therefore, uniformity of plasma processing within planes of the object to be processed increases.

Also, a gas exhaustion pipe is connected to the gas exhaustion hole. An adjusting valve is installed at the gas exhaustion pipe. A flow rate of the temperature controlling gas is controlled by adjusting a degree of opening of the adjusting valve. The temperature of the processing container remains in a predetermined temperature. Therefore, it is possible to suppress a rate of plasma processing or a degree of plasma processing from being changed over time during processing or for each processing. Accordingly, uniformity of plasma processing between the objects to be processed increases.

As described above, it is possible to increase uniformity of plasma processing within planes of the object to be processed or uniformity of plasma processing between the objects to be processed. The following embodiments are based on the above knowledge.

(1) Structure of Plasma Processing Apparatus

Figure 1:
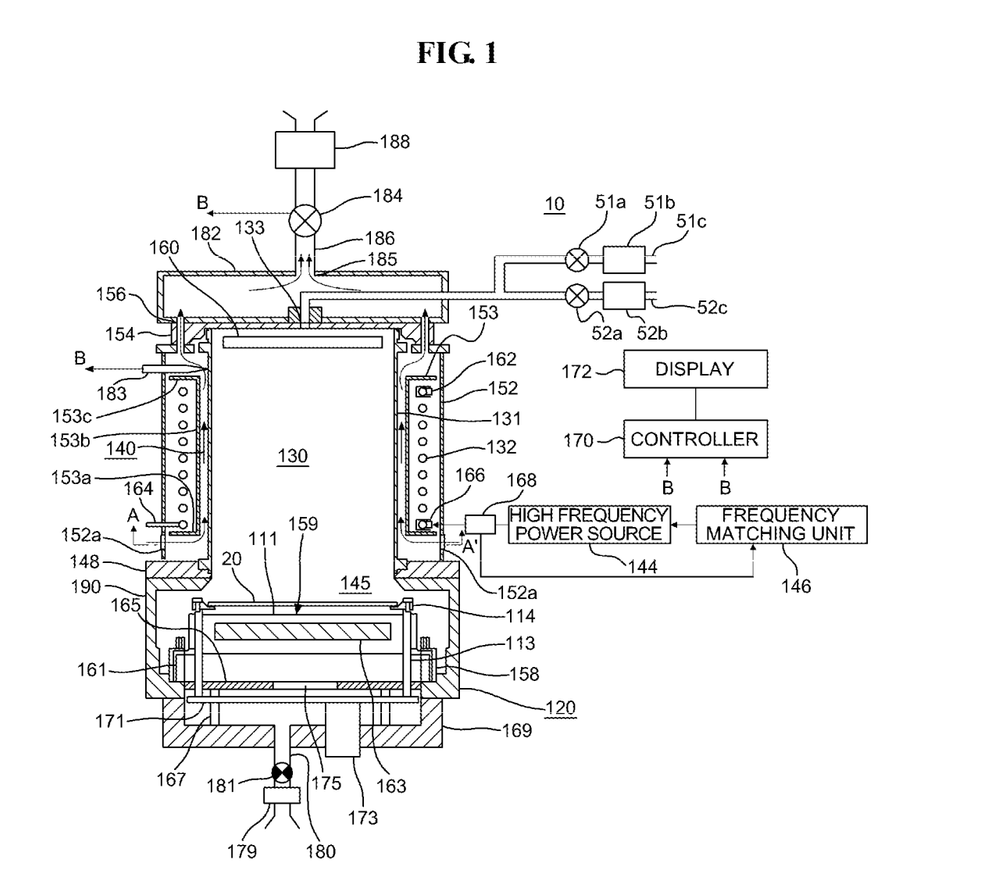
FIG. 1 is a cross sectional view schematically illustrating a plasma processing apparatus according to an embodiment of the present invention.

FIG. 1 is a cross sectional view schematically illustrating a plasma processing apparatus according to an embodiment of the present invention. The plasma processing apparatus 10 includes a processing container 120 configured to accommodate a wafer 20 serving as an object to be processed; a gas supply system configured to supply a processing gas into the processing container 120; an exhaust system configured to exhaust an inside of the processing container 120; a plasma generating unit installed outside the processing container 120 and configured to excite the processing gas supplied into the processing container 120; a gas flow path 140 installed between the processing container 120 and the plasma generating unit such that a temperature controlling gas flows along the outer wall of the processing container 120; a gas introduction hole 152a installed in a circumferential direction of the processing container 120 at equal intervals and configured to introduce the temperature controlling gas into the gas flow path 140; and a gas exhaustion hole 185 configured to exhaust the temperature controlling gas passed through the gas flow path 140. Hereinafter, details thereof will be described.

The term "plasma processing" in the present embodiment refers to, for example, ashing of a resist film formed on a processing surface of the object to be processed. Specifically, the term "plasma processing" refers to, for example, ashing of a resist film applied onto a wafer or performing a descum process on a semiconductor device in which a bump electrode is formed. Also, the descum process refers to a process of removing a resist residue (called a scum) generated when the resist film is patterned. Therefore, in the present embodiment, "the object to be processed" includes a wafer 20 (called a whole wafer) before dicing (before processing), a semiconductor device or a semiconductor package after dicing (after processing) and the like. In the present embodiment, the object to be processed will be described as the wafer 20 before processing.

The plasma processing apparatus 10 includes the processing container 120 that contains a reaction tube 131 and a wafer accommodating unit 190. The plasma processing apparatus 10 may include a loadlock seal (not illustrated) configured to accommodate at least one or a plurality of wafers 20 on which one batch process is performed, and a transfer chamber (not illustrated) having a transfer unit configured to sequentially transfer the wafer 20 into the processing container 120. In the present embodiment, the plasma processing apparatus 10 is a single wafer processing apparatus. In the processing container 120, the wafer 20 is transferred one by one, and plasma processing is sequentially performed on the wafer 20.

(Reaction Tube)

The reaction tube 131 has, for example, a cylindrical shape. The reaction tube 131 is made of, for example, ceramics or quartz glass of high purity. An upper end and a lower end of the reaction tube 131 are opened. The reaction tube 131 is installed on a base plate 148 serving as a stand. A central axis of the reaction tube 131 is installed in a normal line direction of the base plate 148.

A top plate 154 having a disk shape is installed at an upper opening of the reaction tube 131. The top plate 154 seals the upper opening of the reaction tube 131. The top plate 154 comes in contact with the reaction tube 131 through an O ring (not illustrated). A plasma generating region 130 is formed in the reaction tube 131.

A gas introducing port 133 is installed at the center of the top plate 154. The processing gas or a purge gas is supplied into the processing container 120 through the gas introducing port 133.

The gas supply system is connected to the gas introducing port 133. The gas supply system is configured to supply the processing gas or the purge gas into the processing container 120. The gas supply system includes a processing gas supply system configured to supply the processing gas into the processing container 120 and a purge gas supply system configured to supply the purge gas into the processing container 120. Also, the purge gas supply system serves as a carrier gas supply system configured to facilitate supply of the processing gas into the processing container 120.

A downstream end of a pipe 52c through which the processing gas flows is connected to the gas introducing port 133. A valve 52a is installed at the pipe 52c. A mass flow controller 52b is installed upstream from the valve 52a of the pipe 52c. The mass flow controller 52b is configured to adjust a flow rate of the processing gas. A processing gas bombe (not illustrated) is connected upstream from the mass flow controller 52b of the pipe 52c. The processing gas supply system mainly includes the pipe 52c, the valve 52a and the mass flow controller 52b. Also, the processing gas bombe may be included in the processing gas supply system.

A type of the processing gas is appropriately selected according to content of plasma processing. As the processing gas, for example, at least any of oxygen ($O_2$) gas, hydrogen ($H_2$) gas, nitrogen ($N_2$) gas, argon (Ar) gas, helium (He) gas, tetrafluoromethane ($CF_4$) gas and trifluoromethane ($CHF_3$) gas or a combination thereof is used.

A downstream end of a pipe 51c through which the purge gas flows is connected downstream from the valve 52a of the pipe 52c. A valve 51a is installed at the pipe 51c. A mass flow controller 51b is installed upstream from the valve 51a of the pipe 51c. The mass flow controller 51b adjusts a flow rate of the purge gas. A purge gas bombe (not illustrated) is connected upstream from the mass flow controller 51b of the pipe 51c. The purge gas supply system mainly includes the pipe 51c, the valve 51a and the mass flow controller 51b. Also, the purge gas bombe may be included in the purge gas supply system. As the purge gas, for example, $N_2$ gas or an inert gas such as a rare gas is used.

A dispersion plate 160 configured to rectify a gas supplied through the gas introducing port 133 is installed at an upper side in the processing container 120. The dispersion plate 160 is made of, for example, quartz. A planar shape of the dispersion plate 160 is a shape according to an inner diameter of the reaction tube 131 and is substantially circular. The dispersion plate 160 is installed to be separated a predetermined interval from an inner wall of the processing container 120, and is horizontally held. The dispersion plate 160 is formed as a plate having no hole. Therefore, the gas supplied through the gas introducing port 133 collides with the dispersion plate 160, and flows from the upper side to a lower side in the processing container 120 along the inner wall of the processing container 120.

(Plasma Generating Unit)

A resonant coil 132 is installed outside the processing container 120. The resonant coil 132 generates plasma of the processing gas supplied into the processing container 120. The resonant coil 132 is wound along, for example, an outer circumference of the reaction tube 131. A high frequency power source 144 is connected to the resonant coil 132 through an RF sensor 168. The high frequency power source 144 applies high frequency power to the resonant coil 132. Therefore, the processing gas becomes a plasma state in the plasma generating region 130. A frequency matching unit 146 is connected to the resonant coil 132 through the RF sensor 168. The RF sensor 168 is configured to monitor a traveling wave, a reflected wave or the like of high frequency power. A high frequency power value monitored by the RF sensor 168 is fed-back to the frequency matching unit 146. The frequency matching unit 146 is configured to control an oscillation frequency such that the reflected wave of high frequency power is minimized.

The plasma generating unit mainly includes the resonant coil 132. Also, the RF sensor 168, the high frequency power source 144 and the frequency matching unit 146 may be included in the plasma generating unit. In this manner, the plasma processing apparatus 10 is an apparatus configured to perform plasma processing on the object to be processed by, for example, inductive coupling plasma (ICP).

Here, a winding diameter, a winding pitch, the number of windings and the like of the resonant coil 132 are set to resonate in a constant wavelength mode. The resonant coil 132 is configured to form a standing wave of a predetermined wavelength. That is, a length of the resonant coil 132 is set to a length corresponding to an integer multiple (1×, 2×, . . . ) of one wavelength, ½ wavelengths or ¼ wavelengths at a predetermined frequency of high frequency power supplied from the high frequency power source 144. One wavelength has a length of, for example, about 22 m at 13.56 MHz, about 11 m at 27.12 MHz, and about 5.5 m at 54.24 MHz. The number of windings of the resonant coil 132 is, for example, 10. The resonant coil 132 has a winding diameter of, for example, 300 mm or more and 400 mm or less, and preferably 360 mm or more and 370 mm or less.

The resonant coil 132 is made of an insulating material, has a planar shape, and is supported with a plurality of supporting members (not illustrated) that are vertically provided on an upper end surface of the base plate 148. Also, both ends of the resonant coil 132 are electrically grounded. At least one end of the resonant coil 132 is grounded through a movable tap 162. Therefore, when the plasma processing apparatus 10 is initially installed or processing conditions are changed, it is possible to finely adjust the length of the resonant coil 132. The other end of the resonant coil 132 is grounded through a fixed ground 164. Also, between the both grounded ends of the resonant coil 132, a power supply unit is configured by a movable tap 166. Therefore, it is configured to such that, when the plasma processing apparatus 10 is initially installed or processing conditions are changed, an impedance of the resonant coil 132 can be finely adjusted. That is, the resonant coil 132 includes an electrically grounded ground portion at both ends, and includes the power supply unit configured to receive power from the high frequency power source 144 between the ground portions. A ground portion of at least one end is configured as a variable ground portion whose position is adjustable. Also, the power supply unit is configured as a variable power supply unit whose position is adjustable. When the resonant coil 132 includes the variable ground portion and the variable power supply unit, it is possible to easily adjust a resonant frequency and a load impedance of the plasma generating unit.

(Shield Unit)

A shield unit 152 is installed to surround an outside of the resonant coil 132 serving as the plasma generating unit. The shield unit 152 has conductivity. The shield unit 152 shields an electromagnetic wave from leaking to the outside of the resonant coil 132. A capacity component necessary for resonance is formed between the resonant coil 132 and the shield unit 152. The shield unit 152 is made of a conductive material, for example, an aluminum alloy, copper or a copper alloy. The shield unit 152 has a cylindrical shape and is formed of a metal plate that is bent and processed in a cylindrical shape.

Here, when a capacitance capacity between the resonant coil 132 and the shield unit 152 is set to Cs, and a capacitance capacity between the resonant coil 132 and the reaction tube 131 is set to Cp, Cs>>Cp is established. The shield unit 152 is configured to satisfy the above condition. A diameter of the shield unit 152 is set based on an inner diameter of the reaction tube 131 and a winding diameter of the resonant coil 132.

A height of the shield unit 152 is set to be higher than a height of a range at which the resonant coil 132 is disposed.

A lower end of the shield unit 152 preferably comes in contact with the base plate 148 to be described below. For example, when the lower end of the shield unit 152 is separated from the base plate 148, an interval between the shield unit 152 and the base plate 148 is preferably smaller than a diameter of the gas introduction hole 152a of the temperature controlling gas to be described below.

In the present embodiment, the shield unit 152 forms a part of the gas flow path 140 of the temperature controlling gas. Details thereof will be described below.

(Wafer Accommodating Unit)

Below (at an exhaust system side) the reaction tube 131, the wafer accommodating unit 190 is installed. The wafer accommodating unit 190 accommodates the wafer 20. A lower opening of the reaction tube 131 is hermitically connected to the wafer accommodating unit 190. A processing chamber 145 configured to process the wafer 20 is formed in the wafer accommodating unit 190. The processing chamber 145 communicates with the above-described plasma generating region 130. A lower opening of the wafer accommodating unit 190 is sealed by a bottom plate 169 having a bowl shape. Central axes of the wafer accommodating unit 190, the reaction tube 131 and the bottom plate 169 each are vertically disposed.

A susceptor 159 is installed in the processing chamber 145. The susceptor 159 includes a susceptor table 111. The susceptor table 111 supports the wafer 20. Below the susceptor table 111, a plurality of supports 161 are installed. The plurality of supports 161 support the susceptor table 111 from below. A heater 163 is installed in the susceptor 159. The heater 163 heats the wafer 20 supported on the susceptor 159.

Below the susceptor table 111, a lifting substrate 171 is installed. A guide shaft 167 is installed to communicate with the lifting substrate 171. The guide shaft 167 guides lifting of the lifting substrate 171. A plurality of lift pins 113 are installed on the lifting substrate 171 in a vertical direction. The lift pin 113 penetrates an outer circumference portion of the susceptor table 111 in a vertical direction. A substrate holding part 114 is installed at an upper end of the lift pin 113. The substrate holding part 114 extends in a center direction of the susceptor table 111 and holds an outer circumference of the wafer 20. The lifting substrate 171 is connected to an upper end of a lifting shaft 173. The lifting shaft 173 penetrates through the bottom plate 169 and is connected to a lifting drive unit (not illustrated). The lifting drive unit lifts the lifting shaft 173. Therefore, the substrate holding part 114 is lifted through the lifting substrate 171 and the lift pin 113. Also, the wafer 20 can be moved onto the susceptor table 111 from the substrate holding part 114 or the wafer 20 can be moved to the substrate holding part 114 from the susceptor table 111.

Below the susceptor table 111, a baffle ring 158 is installed. The baffle ring 158 has, for example, a cylindrical shape. A space below the susceptor table 111 communicates with the processing chamber 145. On the bottom plate 169, an exhaust plate 165 is horizontally supported through the guide shaft 167. An exhaust communicate hole 175 is installed in the exhaust plate 165. A space formed above the exhaust plate 165 and a space formed below the exhaust plate 165 communicate through the exhaust communicate hole 175.

A gas exhaustion pipe 180 is connected to the center of the bottom plate 169. In the gas exhaustion pipe 180, in order from an upstream end, a pressure sensor (not illustrated), an auto pressure controller (APC) valve 181 and an exhaust device 179 are installed. The exhaust device 179 is configured to exhaust the inside of the processing container 120. When the exhaust device 179 exhausts the inside of the processing container 120, a degree of opening of the APC valve 181 is adjusted based on pressure information from the pressure sensor. Therefore, a pressure in the processing container 120 is adjusted to a predetermined pressure. The exhaust system mainly includes the gas exhaustion pipe 180 and the APC valve 181. Also, the exhaust device 179 may be included in the exhaust system.

Also, the reaction tube 131 and the wafer accommodating unit 190 need not be clearly separated. That is, these may be integrally formed. In this case, at least a part or all of the plasma generating region 130 and the processing chamber 145 may overlap.

(Control Unit)

A controller 170 serving as a control unit is connected to the mass flow controllers 51b and 52b, the valves 51a and 52a, the high frequency power source 144, the frequency matching unit 146, the RF sensor 168, the heater 163, the lifting drive unit, the pressure sensor, the APC valve 181, the exhaust device 179 and the like. The controller 170 is configured to control operations thereof. A display 172 serving as a display unit is connected to the controller 170. The display 172 displays data, for example, a monitoring result of a reflected wave by the RF sensor 168.

(2) Gas Flow Path of Temperature Controlling Gas

Figure 2A:
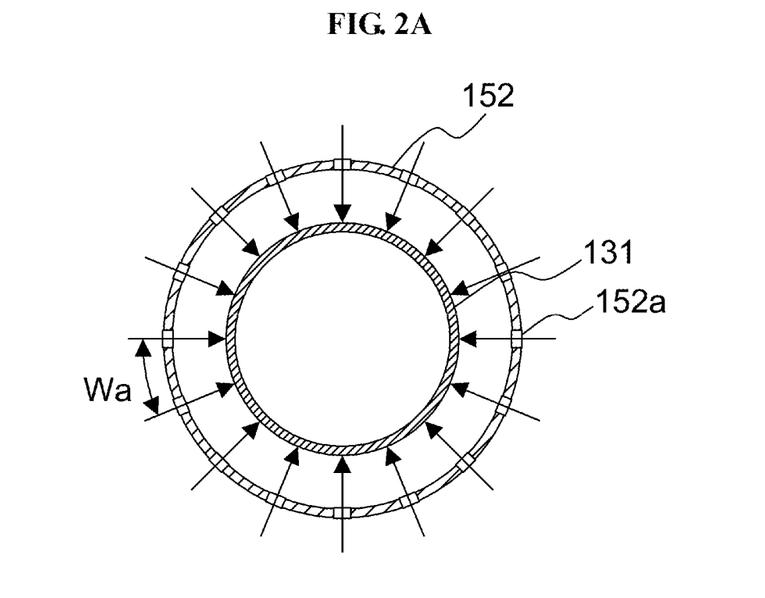
FIG. 2a is a cross sectional view taken along the line A-A' of FIG. 1 as seen from an arrow direction and FIG. 2b is a development view of a shield unit.
Figure 2B:
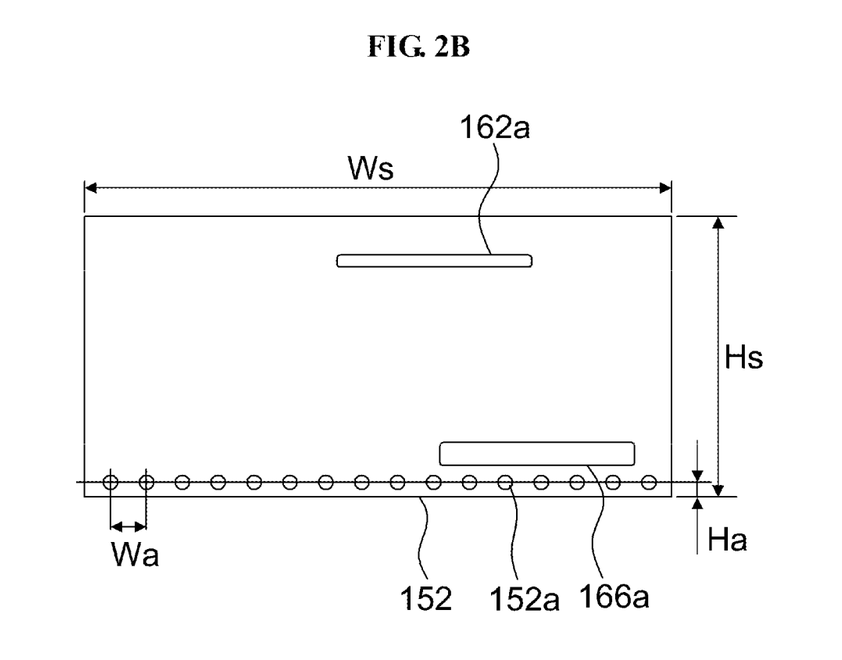

Hereinafter, a detailed configuration of the gas flow path 140 of the temperature controlling gas will be described with reference to FIGS. 1, 2a and 2b. FIG. 2a is a cross sectional view taken along the line A-A' of FIG. 1 as seen from an arrow direction. FIG. 2b is a development view of a shield unit. A solid arrow in FIGS. 1, 2a and 2b indicates a flow of the temperature controlling gas.

In the present embodiment, in order to stabilize a temperature of the processing container 120, the temperature controlling gas flows along the outer wall of the processing container 120. The gas flow path 140 is installed between the processing container 120 and the resonant coil 132 serving as the plasma generating unit, and through which the temperature controlling gas flows along the outer wall of the processing container 120. The temperature of the processing container 120 is stabilized due to so-called forced convection rather than natural convection.

The temperature controlling gas may be, for example, an atmosphere. The temperature controlling gas may be $N_2$ gas or an inert gas such as a rare gas.

(Gas Introduction Hole)

As illustrated in FIG. 1, the gas introduction hole (air intake hole) 152a is installed at the shield unit 152. The gas introduction hole 152a is configured to introduce the temperature controlling gas into the gas flow path 140. The gas introduction hole 152a is installed at a lower end side of the shield unit 152. The gas introduction hole 152a is positioned vertically below the resonant coil 132. The gas introduction hole 152a is installed below the movable tap 166, that is, at an end further below a lower end portion of the resonant coil 132. The temperature controlling gas is introduced from vertically below the resonant coil 132. In other words, the temperature controlling gas is introduced from vertically below the plasma generating region 130.

The number of gas introduction holes 152a, a shape thereof, or a disposition thereof is set according to a required flow rate of the temperature controlling gas. Also, these are set according to an exhaust capacity of an exhaust device 188 to be described below.

As illustrated in FIG. 2a, a plurality of gas introduction holes 152a are installed. The plurality of gas introduction holes 152a are disposed in the circumferential direction of the processing container 120 within the gas flow path 140 at equal intervals. The term "the circumferential direction of the processing container 120" refers to the circumferential direction of the processing container 120 in a birds-eye view of the plasma processing apparatus 10. Each of the plurality of gas introduction holes 152a introduces the temperature controlling gas in a center direction of the reaction tube 131. The temperature controlling gas is introduced through the plurality of gas introduction holes 152a, and collides with the outer wall of the processing container 120 at a uniform flow rate and a uniform flow velocity. Therefore, the processing container 120 is easily uniformly cooled in the circumferential direction due to the temperature controlling gas.

As described above, the shield unit 152 is installed to surround an outside of the resonant coil 132 serving as the plasma generating unit. The plurality of gas introduction holes 152a are installed in the shield unit 152. At least a part of the gas flow path 140 is installed between the processing container 120 and the shield unit 152.

As illustrated in FIG. 2b, the gas introduction hole 152a has a cross-sectional shape, for example, a circular shape. The number of gas introduction holes 152a, a diameter thereof, or a disposition thereof is designed according to a required exhaust amount of the exhaust device 188. For example, when a required flow rate of the temperature controlling gas is about 3 m$^3$/min, a flow velocity of the temperature controlling gas may be about 1 m/sec to 3 m/sec. In this case, for example, a diameter of the gas introduction hole 152a is 20 mm or more and 40 mm or less. The number of gas introduction holes 152a is, for example, 10 or more and 100 or less and preferably 15 or more and 50 or less. An interval Wa between the plurality of gas introduction holes 152a is, for example, 10 mm or more and 40 mm or less. A height Ha from the lower end of the shield unit 152 to the center of the gas introduction hole 152a is, for example, about 1/10 of a height Hs of the shield unit 152, and is, for example, 20 mm or more and 50 mm or less. Also, since the shield unit 152 comes in contact with the base plate 148, the height Ha from the lower end of the shield unit 152 to the center of the gas introduction hole 152a is, for example, the same as a height from the base plate 148 to the center of the gas introduction hole 152a.

In the shield unit 152, an opening 162a for the movable tap 162 and an opening 166a for the movable tap 166 are installed. The fixed ground 164 is withdrawn from the opening 166a for the movable tap 166. The opening 162a is installed in a movable range of the movable tap 162. The opening 166a is installed in a movable range of the movable tap 166.

(Gas Guide)

A gas guide (an air flow guide) 153 is installed between the processing container 120 and the resonant coil 132. The gas guide 153 surrounds the outer wall of the processing container 120. The gas guide 153 is configured to guide the temperature controlling gas between the processing container 120 and the resonant coil 132 through the gas introduction hole 152a. A part of the gas flow path 140 is formed between the processing container 120 and the gas guide 153. The temperature controlling gas efficiently flows between the processing container 120 and the resonant coil 132. The gas guide 153 is fixed to the base plate 148, the reaction tube 131 or the shield unit 152.

For example, the gas guide 153 has the following shape. An intermediate portion 153b is installed to surround the processing container 120. The intermediate portion 153b has, for example, a cylindrical shape. A flange unit 153a is installed at the gas introduction hole 152a side of the intermediate portion 153b. The flange unit 153a comes in contact with a lower end of the intermediate portion 153b. The flange unit 153a is installed to suppress the temperature controlling gas from leaking between the gas guide 153 and the shield unit 152. The flange unit 153a is installed between the gas introduction hole 152a and a lower end of the resonant coil 132. The flange unit 153a is installed below the opening 166a for the movable tap 166. The flange unit 153a extends to the outside from the intermediate portion 153b in a diameter direction. An end at the shield unit 152 side within the flange unit 153a is installed in a substantially arc shape along a shape inside the shield unit 152. The temperature controlling gas mainly flows between the gas guide 153 and the processing container 120 at a high speed, rather than between the gas guide 153 and the shield unit 152. Therefore, the processing container 120 is efficiently cooled.

A flange unit 153c is installed at a side opposite to the flange unit 153a of the intermediate portion 153b. The flange unit 153c comes in contact with an upper end of the intermediate portion 153b. The flange unit 153c is installed above the opening 162a of the movable tap 162. The temperature controlling gas is mainly exhausted between the gas guide 153 and the processing container 120 rather than between the gas guide 153 and the shield unit 152.

The gas guide 153 mainly includes the flange unit 153a and the intermediate portion 153b. Also, the flange unit 153c may be included in the gas guide 153. Also, the flange unit 153a, the intermediate portion 153b and the flange unit 153c need not be clearly separated.

Here, when an outer diameter of the reaction tube 131 of the processing container 120 is set to $\varphi_c$, an inner diameter (an inner diameter of the intermediate portion 153b) of the gas guide 153 is set to $\varphi_g$, and an inner diameter of the shield unit 152 is set to $\varphi_s$, an interval $d_{cg}$ between the processing container 120 and the gas guide 153 and an interval $d_{gs}$ between the gas guide 153 and the shield unit 152 are obtained by the following equations. Also, a thickness of the gas guide 153 is set to a degree that is negligible with respect to the inner diameter and the outer diameter. An inner diameter of the gas guide 153 is set to be the same as an outer diameter of the gas guide 153.

$$d_{cg}(\varphi_g-\varphi_c)/2, d_{gs}(\varphi_s-\varphi_g)/2$$

As a width of the gas flow path 140 decreases, a flow velocity of the temperature controlling gas increases. As the flow velocity of the temperature controlling gas increases, a heat transfer rate between the temperature controlling gas and the processing container 120 increases. Therefore, the interval $d_{cg}$ between the processing container 120 and the gas guide 153 is preferably smaller than the interval $d_{gs}$ between the gas guide 153 and the shield unit 152. That is, $d_{cg}<d_g$, is preferable. A flow velocity of the temperature controlling gas between the processing container 120 and the gas guide 153 is higher than a flow velocity of the temperature controlling gas at other parts of the gas flow path 140. Therefore, a heat transfer rate increases between the temperature controlling gas and the processing container 120.

Also, when forced convection of the temperature controlling gas is not performed, natural convection may occur in an enclosed space between the shield unit 152 and the processing container 120. In natural convection, a heat transfer rate among the processing container 120, the enclosed space and the processing container 120 may be 5 W/m$^2$K or more and 20 W/m$^2$K or less.

Meanwhile, when forced convection due to the temperature controlling gas is performed as in the present embodiment, a heat transfer rate between the temperature controlling gas and the processing container 120 may be 25 W/m$^2$K or more and 250 W/m$^2$K or less. In order to stabilize a temperature of the processing container 120, a heat transfer rate of the processing container 120 of at least several tens of W/m²K or more is required. As a flow velocity at a part between the processing container 120 and the shield unit 152 within the gas flow path 140, several tens of msec or more is required. In order to satisfy these requirements, the interval $d_{cg}$ between the gas guide 153 and the processing container 120 is preferably, for example, 2 mm or more and 5 mm or less. Therefore, the above heat transfer rate is implemented.

Also, when a diameter of an end at the shield unit 152 side within the flange unit 153a is set to $\varphi_f$, the interval $d_{fs}$ [that is, an interval $d_{fs}$ at a gap between the flange unit 153a and the shield unit 152] between the end of the flange unit 153a and the shield unit 152 is obtained by the following equation.

$$d_{fs}=(\varphi_s-\varphi_f)/2$$

The interval $d_{fs}$ between the end of the flange unit 153a and the shield unit 152 is negligibly small, compared to the interval $d_{cg}$ between the processing container 120 and the gas guide 153. That is, $d_{fs} \ll d_{cg}$ is established. Therefore, it is possible to suppress the temperature controlling gas from leaking between the gas guide 153 and the shield unit 152.

The flange unit 153a is positioned above the gas introduction hole 152a. A height from the base plate 148 to the flange unit 153a is, for example, 20 mm or more and 50 mm or less.

The gas guide 153 has a thickness of, for example, 2 mm or more and 5 mm or less. When the thickness of the gas guide 153 is within the above range, a capacitance capacity Cp between the resonant coil 132 and the shield unit 152 is not easily influenced by insertion of the gas guide 153. Also, when plasma processing is performed, the gas guide 153 is not easily changed due to heat from the processing container 120.

The gas guide 153 is made of, for example, a material of a low dielectric constant. For example, the material of the gas guide 153 has a lower dielectric constant than a material of the reaction tube 131. When the reaction tube 131 is made of quartz (dielectric constant is 3.8), a dielectric constant of the gas guide 153 is, for example, 3.8 or less. Therefore, the capacitance capacity Cp between the resonant coil 132 and the shield unit 152 is not easily influenced by insertion of the gas guide 153.

Also, the gas guide 153 may be made of, for example, an insulating material. On the other hand, when the gas guide 153 has conductivity, an inside of the reaction tube 131 is electrically shielded by the gas guide 153. When the gas guide 153 is made of an insulating material, it is difficult to decrease plasma generation in the reaction tube 131.

Also, the gas guide 153 may be made of, for example, a material having thermal resistance. The gas guide 153 is closer to the reaction tube 131 than to the resonant coil 132. The gas guide 153 may be heated to, for example, about 200° C. When the gas guide 153 is made of a polymeric material, a material glass transition temperature of the gas guide 153 is, for example, 200° C. or more. Therefore, the gas guide 153 keeps its shape when plasma processing is performed.

Specifically, the gas guide 153 is made of any material of Teflon (registered trademark), polytetrafluoroethylene (PTFE), polychlorotrifluoroethylene (PCTFE), polyether ether ketone (PEEK), polyoxymethylene (POM), Vespel (registered trademark) and polybenzimidazole (PBI). In this case, the gas guide 153 satisfies above-described requirements of the dielectric constant, the insulating property and the thermal resistance.

(Intermediate Opening)

An intermediate opening 156 is installed above at least the resonant coil 132. For example, the intermediate opening 156 is installed on the top plate 154. The intermediate opening 156 is installed between the resonant coil 132 and the gas exhaustion hole 185 to be described below within the gas flow path 140. The intermediate opening 156 connects a part between the processing container 120 and the shield unit 152 and a gas buffer unit 182 to be described below. The intermediate opening 156 is installed, for example, outside an upper end of a cylindrical part of the reaction tube 131.

Also, when the reaction tube 131 includes an extending part (a reference numeral is not shown) that extends from a cylindrical part in a diameter direction, the intermediate opening 156 may also be installed in the extending part. In this case, the intermediate opening 156 communicates with the extending part of the reaction tube 131 and the top plate 154.

For example, a plurality of intermediate openings 156 are installed. The plurality of intermediate openings 156 are installed in an annular shape to surround the processing container 120. The plurality of intermediate openings 156 are disposed in the circumferential direction of the processing container 120 within the gas flow path 140 at equal intervals. The plurality of intermediate openings 156 each are installed at a position that each of the plurality of gas introduction holes 152a overlaps, for example, in a birds-eye view of the plasma processing apparatus 10. The temperature controlling gas is introduced through the plurality of gas introduction holes 152a, and flows toward the plurality of intermediate openings 156. The plurality of intermediate openings 156 each have substantially a circular shape.

(Gas Buffer Unit)

The gas buffer unit (air pumping box) 182 is installed vertically above the processing container 120. The gas buffer unit 182 is disposed above the top plate 154. The gas buffer unit 182 is installed between the intermediate opening 156 and the gas exhaustion hole 185 to be described below within the gas flow path 140. The gas buffer unit 182 is installed downstream [the gas exhaustion hole 185 side to be described below] from the resonant coil 132 within the gas flow path 140.

The gas buffer unit 182 is connected to all of the plurality of intermediate openings 156. The gas buffer unit 182 is designed not to interfere with advancing of the temperature controlling gas. A conductance in the gas buffer unit 182 is greater than a conductance of a space between the gas introduction hole 152a and the gas buffer unit 182. A volume in the gas buffer unit 182 is greater than a volume of a space between the gas guide 153 and the processing container 120.

The gas buffer unit 182 may have a columnar shape, a polygonal columnar shape, a cone shape or a polygonal cone shape. A bottom of the gas buffer unit 182 has a diameter of, for example, 450 mm or more and 550 mm or less.

A height of the gas buffer unit 182 is higher than a diameter of the intermediate opening 156. The height of the gas buffer unit 182 is, for example, 50 mm or more and 200 mm or less. Therefore, when the temperature controlling gas is introduced into the gas buffer unit 182 through the intermediate opening 156, it is difficult to interfere with a flow toward the gas exhaustion hole 185.

(Gas Exhaustion Hole)

The gas exhaustion hole 185 is installed vertically above the processing container 120. The gas exhaustion hole 185 is configured to exhaust the temperature controlling gas from the gas flow path 140. The gas exhaustion hole 185 is installed at a side opposite to the intermediate opening 156 of the gas buffer unit 182. The gas exhaustion hole 185 is disposed at the center of the gas buffer unit 182 in a birds-eye view of the plasma processing apparatus 10. The plurality of intermediate openings 156 are disposed from the gas exhaustion hole 185 at equal distances. More preferably, the plurality of intermediate openings 156 are disposed point-symmetrically with respect to the center of the gas buffer unit 182 in a birds-eye view of the plasma processing apparatus 10. The temperature controlling gas flows toward the center of the processing container 120 from each of the intermediate openings 156 in a diameter direction in a birds-eye view of the plasma processing apparatus 10. Therefore, a flow velocity of the temperature controlling gas at a part along the outer wall of the processing container 120 is likely to be uniformized in the circumferential direction.

(Gas Exhaustion Pipe and Exhaust Device)

A gas exhaustion pipe 186 is connected to the gas exhaustion hole 185. The exhaust device 188 is connected to a side opposite to the gas exhaustion hole 185 of the gas exhaustion pipe 186. The exhaust device 188 forcefully exhausts the temperature controlling gas through the gas exhaustion hole 185 to form the gas flow path 140 from the gas introduction hole 152a to the gas exhaustion hole 185 within the gas flow path 140. Also, the exhaust device 188 is not necessarily installed as a dedicated product of the plasma processing apparatus 10. The exhaust device 188 may be a common duct installed in a cleanroom.

An adjusting valve (control damper) 184 is installed at the gas exhaustion pipe 186. The adjusting valve 184 is configured to adjust a flow rate of the temperature controlling gas flowing in the gas exhaustion pipe 186. The adjusting valve 184 decreases (dumps) a flow rate of the temperature controlling gas when a constant amount of the temperature controlling gas is exhausted. The adjusting valve 184 is a damper.

A flow rate of the temperature controlling gas flowing in the gas flow path 140 is, for example, 1 m³/min or more and 10 m³/min or less. The gas exhaustion hole 185 has an inner diameter of, for example, 50 mm or more and 100 mm or less. Also, an inner diameter of the gas exhaustion pipe 186 is the same as, for example, the inner diameter of the gas exhaustion hole 185.

(Gas Flow Path of Temperature Controlling Gas)

For example, the plurality of gas introduction holes 152a, the gas guide 153, the plurality of intermediate openings 156, the gas buffer unit 182 and the gas exhaustion hole 185 constitute the gas flow path 140 of the temperature controlling gas. The temperature controlling gas flows in order thereof. Also, the gas exhaustion pipe 186, the adjusting valve 184 and the exhaust device 188 may be included in the gas flow path 140.

The plurality of gas introduction holes 152a are disposed in the circumferential direction of the processing container 120 within the gas flow path 140 at equal intervals. The temperature controlling gas is uniformly introduced through the plurality of gas introduction holes 152a in the circumferential direction. Therefore, the processing container 120 is likely to be uniformly cooled in the circumferential direction due to the temperature controlling gas.

The gas guide 153 is installed between the processing container 120 and the resonant coil 132 to surround the outer wall of the processing container 120. Therefore, the gas flow path 140 becomes narrower at a part along the processing container 120 by the gas guide 153. The temperature controlling gas flows at a high speed between the processing container 120 and the resonant coil 132. Therefore, cooling of the processing container 120 is facilitated.

The plurality of intermediate openings 156 are installed between the resonant coil 132 and the gas exhaustion hole 185. The plurality of intermediate openings 156 are disposed in the circumferential direction of the processing container 120 within the gas flow path 140 at equal intervals. The temperature controlling gas is introduced through the plurality of gas introduction holes 152a and flows toward the plurality of intermediate openings 156. A flow rate and a flow velocity of the temperature controlling gas are uniformized between the gas introduction hole 152a and the intermediate opening 156 in the circumferential direction. Therefore, the processing container 120 is likely to be uniformly cooled in the circumferential direction due to the temperature controlling gas.

The gas buffer unit 182 is installed between the intermediate opening 156 and the gas exhaustion hole 185. A conductance in the gas buffer unit 182 is greater than a conductance of a space between the gas introduction hole 152a and the intermediate opening 156. Therefore, when the temperature controlling gas is introduced into the gas buffer unit 182, it is difficult to interfere with a flow toward the gas exhaustion hole 185.

The gas exhaustion hole 185 is installed at a side opposite to the intermediate opening 156 of the gas buffer unit 182. Only one gas exhaustion hole 185 is disposed at the center of the plurality of intermediate openings 156 in a birds-eye view of the plasma processing apparatus 10. A flow velocity at a part between the gas introduction hole 152a and the intermediate opening 156 within the gas flow path 140 is uniformized in the circumferential direction of the processing container 120. Therefore, the processing container 120 is likely to be uniformly cooled in the circumferential direction.

In this manner, the temperature controlling gas is introduced through the gas introduction hole 152a, and is exhausted from the gas exhaustion hole 185 through the outer wall of the processing container 120. Here, the temperature controlling gas flows in a direction opposite to that of the processing gas. The temperature controlling gas flows from the lower side to the upper side of the processing container 120. That is, the temperature controlling gas flows from the exhaust system side of the processing container 120 to the gas supply system of the processing container 120. A part of the gas flow path 140 is formed in a length direction of the reaction tube 131. The outer wall of the processing container 120 is cooled due to the temperature controlling gas. On the other hand, the temperature controlling gas is heated by the outer wall of the processing container 120. The temperature controlling gas may flow in the same direction of an ascending air current due to the heat.

(Control of Temperature Controlling Gas)

The controller 170 serving as a control unit is connected to the adjusting valve 184. The controller 170 is configured to control a flow rate of the temperature controlling gas by adjusting a degree of opening of the adjusting valve 184. For example, when a temperature of the processing container 120 is lower than a predetermined temperature, the controller 170 decreases a degree of opening of the adjusting valve 184. Therefore, the temperature of the processing container 120 increases to the predetermined temperature. On the other hand, when the temperature of the processing container 120 is greater than the predetermined temperature, the controller 170 increases the degree of opening of the adjusting valve 184. Therefore, the temperature of the processing container 120 decreases to the predetermined temperature. In this manner, the temperature of the processing container 120 remains in the predetermined temperature.

Also, the term "temperature of the processing container 120" used herein refers to a temperature of the outer wall of the processing container 120 and a temperature inside the processing container 120. Also, the term "predetermined temperature" used herein may refer to a constant temperature range in which a rate of plasma processing or a degree of plasma processing becomes a predetermined rate or a predetermined degree.

A temperature measurement unit 183 is installed in the gas flow path 140. The temperature measurement unit 183 penetrates through, for example, the shield unit 152, and comes in contact with the processing container 120. The temperature measurement unit 183 penetrates through the shield unit 152 and comes in contact with an outer wall of the reaction tube 131. The temperature measurement unit 183 is configured to measure a temperature of the processing container 120. The temperature measurement unit 183 is disposed downstream from the resonant coil 132 of the gas flow path 140. The temperature measurement unit 183 is, for example, a type K thermocouple (TC) or a platinum resistance temperature detector (RTD).

The temperature measurement unit 183 may be installed to be pressed to the processing container 120 with a constant force due to a spring structure. Even when an installation state is changed due to thermal expansion, the temperature measurement unit 183 and the processing container 120 remain in contact. Therefore, the temperature measurement unit 183 can stably measure the temperature of the processing container 120.

The controller 170 serving as a control unit is connected to the temperature measurement unit 183. The controller 170 is configured to control the adjusting valve 184 based on temperature information from the temperature measurement unit 183. The temperature of the processing container 120 remains in the predetermined temperature.

(3) Plasma Processing Method

Figure 3:
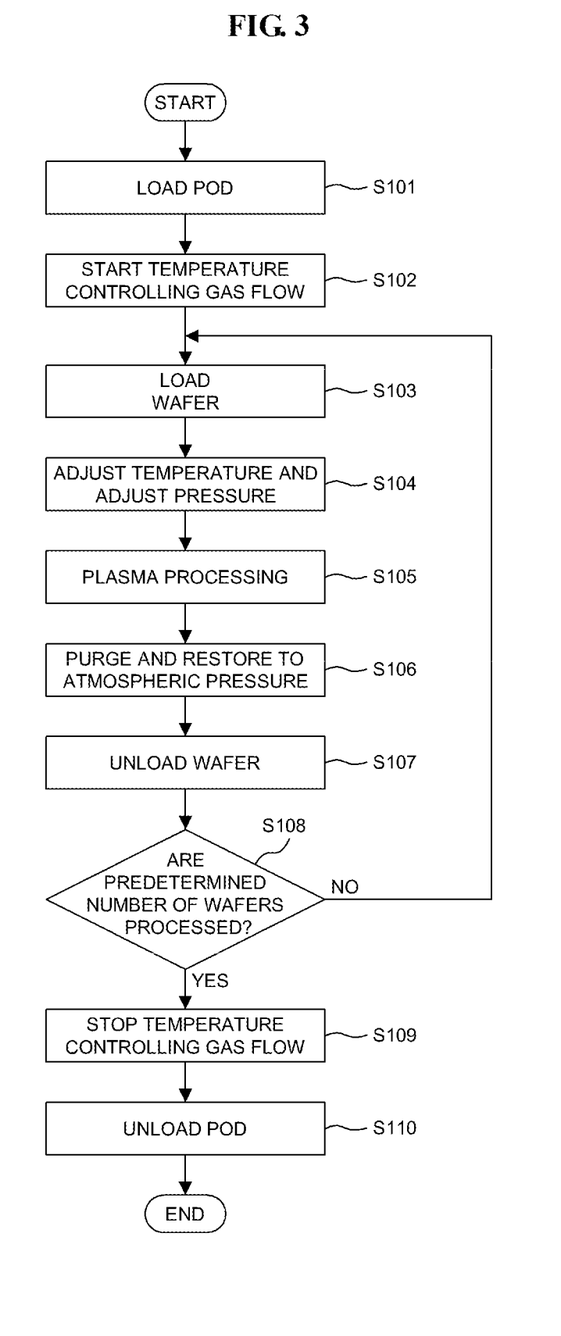
FIG. 3 is a flowchart illustrating a method of manufacturing a semiconductor device according to an embodiment of the present invention.

FIG. 3 is a flowchart illustrating a plasma processing method according to an embodiment of the present invention. As a process among processes of manufacturing a semiconductor device, a plasma processing process according to the present embodiment will be described with reference to FIG. 3. Hereinafter, for example, a case in which a resist film applied onto the wafer 20 is ashed will be described. The plasma processing process is performed by the above-described plasma processing apparatus 10. In the following description, operations of respective units of the plasma processing apparatus 10 are controlled by the controller 170.

(Pod Loading)

A pod (not illustrated) including, for example, 25 wafers 20, is transferred to the loadlock seal (not illustrated) of the plasma processing apparatus 10. A processing surface of each of the wafers 20 is coated with, for example, a resist film (S101).

(Start Temperature Controlling Gas Flow)

The exhaust device 188 is operated to start exhaustion of the temperature controlling gas in the gas flow path 140. The temperature controlling gas is introduced into the gas flow path 140 through the gas introduction holes 152a disposed in the circumferential direction of the processing container 120 at equal intervals. The controller 170 controls a flow rate of the temperature controlling gas by adjusting a degree of opening of the adjusting valve 184 based on temperature information from the temperature measurement unit 183. For example, when the temperature of the processing container 120 is lower than the predetermined temperature, for example, when processing starts, the controller 170 decreases a degree of opening of the adjusting valve 184 or a flow rate of the temperature controlling gas is set to be smaller. Also, flow rate control of the temperature controlling gas is continuously performed, for example, until the plasma processing process ends (S102).

(Wafer Loading)

Next, the transfer unit picks up one wafer 20 from the loadlock seal and loads the wafer 20 in the processing chamber 145. The lift pin 113 is raised by the lifting shaft 173, and the wafer 20 is placed on the lift pin 113. The transfer unit is extracted from the processing chamber 145. The lift pin 113 is lowered by the lifting shaft 173 and the wafer 20 is lowered to a predetermined processing position. Therefore, the wafer 20 is moved onto the susceptor table 111 (S103).

(Temperature Adjustment and Pressure Adjustment)

The inside of the processing container 120 is vacuum-exhausted by the exhaust device 179 such that the inside of the processing container 120 has a predetermined pressure (degree of vacuum). In this case, the controller 170 controls a pressure in the processing container 120 by adjusting a degree of opening of the APC valve 181 based on pressure information of the inside of the processing container 120, which is measured by the pressure sensor. The pressure of the inside of the processing container 120 is controlled to be a predetermined pressure within a range, for example, 30 Pa to 530 Pa. Also, the exhaust device 179 is continuously operated during at least the plasma processing process. Also, control of the pressure of the inside of the processing container 120 is continuously performed during at least the plasma processing process.

Also, the susceptor 159 is heated by the heater 163 such that the temperature of the wafer 20 becomes a predetermined temperature. Heat adjustments is performed such that the wafer 20 has a predetermined processing temperature in a range of, for example, 180° C. to 250° C., due to thermal conductivity from the susceptor table 111 or radiation from the heater 163. Also, temperature control of the wafer 20 is continuously performed during at least the plasma processing process (S104).

(Plasma Processing)

Next, when the temperature of the wafer 20 increases to a predetermined temperature, the gas supply system supplies the processing gas into the processing container 120. Specifically, the valve 52a of the processing gas supply system is opened, and the processing gas is supplied into the processing container 120 while a flow rate of the processing gas is adjusted by the mass flow controller 52b. The processing gas supplied into the processing container 120 is dispersed by the dispersion plate 160 and flows downward along the inner wall of the reaction tube 131.

When the processing gas is supplied, plasma of the processing gas is generated by the plasma generating unit at the same time. Specifically, high frequency power is applied to the resonant coil 132 from the high frequency power source 144. As a result, plasma discharge is generated in the plasma generating region 130 and thus the processing gas becomes a plasma state. The processing gas in a plasma state flows toward the processing chamber 145 from the plasma generating region 130 and is supplied to the wafer 20. As a result, the resist film formed on the processing surface of the wafer 20 is ashed.

As the processing gas, for example, at least any of $O_2$ gas, $H_2$ gas, $N_2$ gas, Ar gas, He gas, tetrafluoromethane ($CF_4$) gas and trifluoromethane ($CHF_3$) gas or a combination thereof is used. Also, a flow rate of the processing gas is adjusted within a range of, for example, 800 sccm to 2,600 sccm, by the mass flow controller 52b. Also, a processing pressure is set within a range of, for example, 30 Pa to 530 Pa. Also, high frequency power applied to the resonant coil 132 is set within a range of, for example, 600 W to 2,000 W. Also, a transmission frequency of the high frequency power source 144 is bound to a resonant frequency of the resonant coil 132. In this case, the RF sensor 168 monitors a reflected wave from the resonant coil 132 and transmits a level of the monitored reflected wave to the frequency matching unit 146. The frequency matching unit 146 adjusts the transmission frequency of the high frequency power source 144 such that a reflected wave of reflected wave power is minimized. Therefore, even when a gas flow rate, a gas mixture ratio, and processing conditions of the pressure are changed, the transmission frequency of the high frequency power source 144 immediately matches.

During plasma processing, for example, when the temperature of the processing container 120 is higher than a predetermined temperature, a degree of opening of the adjusting valve 184 is set to be higher. A flow rate of the temperature controlling gas increases. Therefore, the temperature of the processing container 120 decreases to the predetermined temperature. On the other hand, when the temperature of the processing container 120 is lower than the predetermined temperature, a degree of opening of the adjusting valve 184 is set to be lower. Therefore, the temperature of the processing container 120 increases to the predetermined temperature. In this manner, the temperature of the processing container 120 remains in the predetermined temperature.

When the resist film on the processing surface of the wafer 20 is removed, power supply from the high frequency power source 144 to the resonant coil 132 is stopped. Also, supply of the processing gas from the gas supply system to the processing container 120 is stopped. Therefore, plasma processing on the wafer 20 ends (S105).

(Purging and Restoring to Atmospheric Pressure)

Next, after power supply to the resonant coil 132 and supply of the processing gas are stopped, the APC valve 181 is fully opened and the inside of the processing container 120 is exhausted for a predetermined time. In this case, the valve 51a of the purge gas supply system is opened, and the purge gas is supplied into the processing container 120 while a flow rate of the purge gas is adjusted by the mass flow controller 51b. Therefore, the inside of the processing container 120 is replaced with the purge gas. Also, a degree of opening of the APC valve 181 is adjusted and the inside of the processing container 120 is restored to atmospheric pressure (S106).

(Wafer Unloading)

Next, the processed wafer 20 is unloaded from the inside of the processing chamber 145. The processed wafer 20 is returned to the pod (S107).

(Determination of Batch Process End)

Next, it is determined whether plasma processing on a predetermined number of wafers 20 is completely performed (S108). The predetermined number refers to, for example, the number of wafers 20 accommodated in the pod installed in the plasma processing apparatus 10, for example, 25 wafers.

When plasma processing on the predetermined number of wafers 20 is not completely performed (No in S108), similarly, step (S103) to step (S107) are performed again.

(Stop Temperature Controlling Gas Flow)

When plasma processing on the predetermined number of wafers 20 is completely performed (Yes in S108), the exhaust device 188 is stopped. Therefore, a temperature controlling gas flow is stopped (S109). In this manner, until plasma processing on the predetermined number of wafers 20 is performed, the temperature controlling gas continuously flows in the gas flow path 140.

(Pod Unloading)

The pod including the processed wafer 20 is unloaded from the plasma processing apparatus 10 (S110). In this manner, the plasma processing process in the present embodiment ends.

(4) Effects of the Present Embodiment

According to the present embodiment, one or a plurality of effects to be described will be obtained.

(a) According to the present embodiment, the gas flow path 140 is installed at least between the processing container 120 and the resonant coil 132 of the plasma generating unit. The temperature controlling gas flows along the outer wall of the processing container 120 by the gas flow path 140. The plurality of gas introduction holes 152a are uniformly disposed in the circumferential direction of the processing container 120 within the gas flow path 140 and introduce the temperature controlling gas into the gas flow path 140. The temperature controlling gas is uniformly introduced through the plurality of gas introduction holes 152a in the circumferential direction of the processing container 120. The processing container 120 is uniformly cooled in the circumferential direction due to the temperature controlling gas. The temperature of the processing container 120 is uniformized in the circumferential direction. A temperature distribution of the wafer 20 itself is uniformly maintained in the planar direction or a plasma density of the plasma generating region 130 is uniformly maintained in the planar direction of the wafer 20. Therefore, plasma processing is uniformly performed within planes of the wafer 20. Uniformity of a rate of plasma processing or a degree of plasma processing within planes of the wafer 20 increases.

Figure 4A:
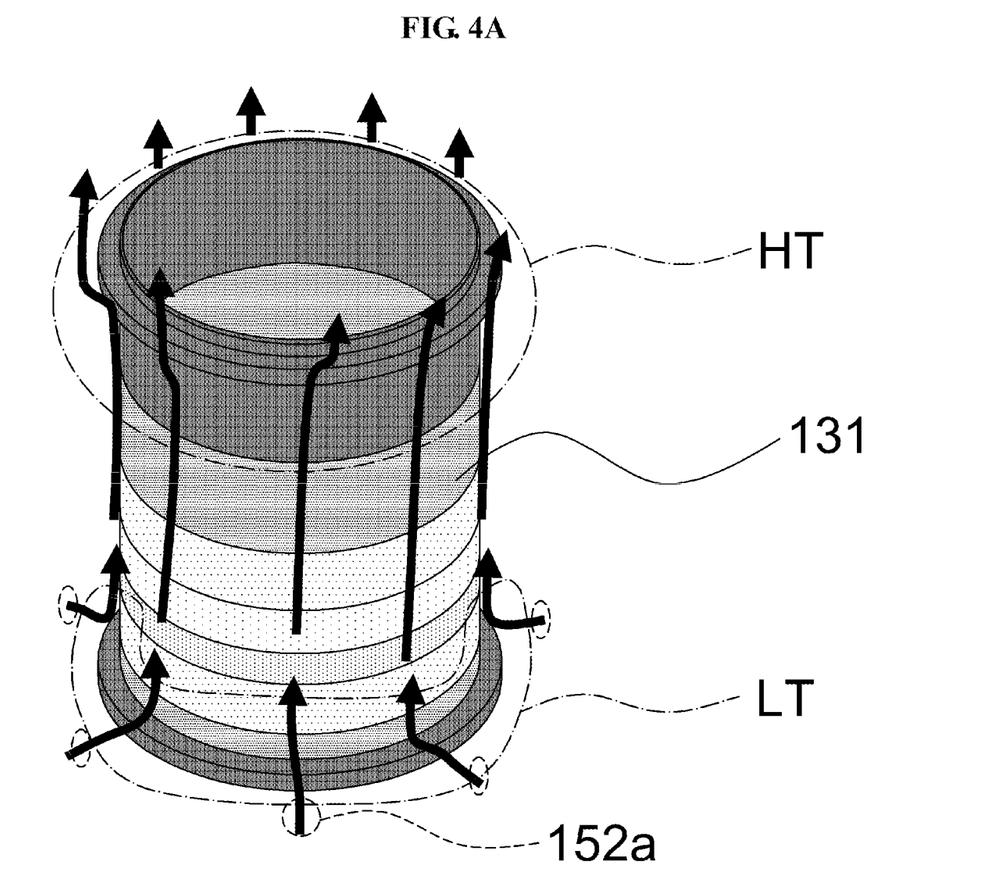
FIG. 4a is a diagram schematically illustrating a temperature distribution of a processing container according to an embodiment of the present invention.
Figure 4B:
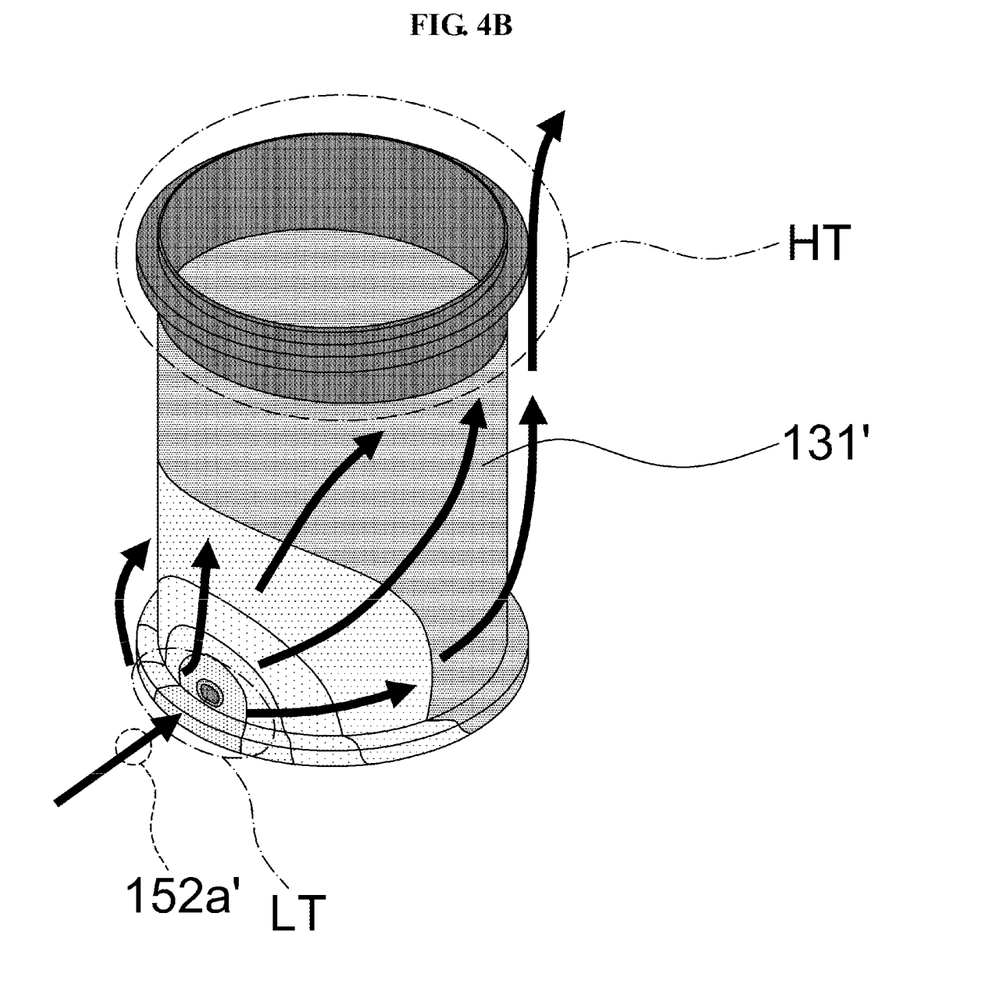
FIG. 4b is a diagram schematically illustrating a temperature distribution of a processing container according to a first comparative example.

Here, as a first comparative example, a case in which the gas introduction holes 152a are non-uniformly disposed in the gas flow path 140 will be described with reference to FIGS. 4a and 4b. FIG. 4a is a diagram schematically illustrating a temperature distribution of the processing container 120 according to an embodiment of the present invention. FIG. 4b is a diagram schematically illustrating a temperature distribution of the processing container 120 according to the first comparative example. In FIGS. 4a and 4b, a solid arrow indicates a flow of the temperature controlling gas. Also, in FIGS. 4a and 4b, a contrast distribution of the reaction tube 131 illustrates a temperature distribution of the reaction tube 131.

As illustrated in FIG. 4b, in the first comparative example, for example, a gas introduction hole 152a' is installed in only a part of the shield unit (not illustrated). Only a part of an outer wall of a reaction tube 131' is cooled. In the first comparative example, a low temperature region LT is more localized than a high temperature region HT. A temperature of the reaction tube 131' is non-uniformized in the circumferential direction. In this case, a temperature distribution of the wafer itself is non-uniformized in the planar direction in some cases or a plasma density of the plasma generating region is non-uniformized in the planar direction of the wafer in some cases. A rate of plasma processing or a degree of plasma processing at a part at which the temperature of the reaction tube 131' is low is lower than a rate of plasma processing or a degree of plasma processing at a part at which the temperature of the reaction tube 131' is high. Accordingly, plasma processing within planes of the wafer may be non-uniformized.

However, according to the present embodiment of FIG. 4a, the reaction tube 131 is uniformly cooled in the circumferential direction due to the temperature controlling gas. In the present embodiment, similarly to the high temperature region HT, the low temperature region LT is uniformly distributed in the circumferential direction of the reaction tube 131. Therefore, uniformity of plasma processing within planes of the wafer increases.

(b) According to the present embodiment, the controller 170 serving as a control unit controls a flow rate of the temperature controlling gas by adjusting a degree of opening of the adjusting valve 184 installed at the gas exhaustion pipe 186. The temperature of the processing container 120 remains in the predetermined temperature. Therefore, it is possible to suppress a rate of plasma processing or a degree of plasma processing from being changed over time during processing or for each processing. Accordingly, uniformity of plasma processing between the wafers 20 increases.

Here, as a second comparative example, a case in which a controller does not control a flow rate of the temperature controlling gas will be described. In the second comparative example, heat dissipation from the processing container includes only natural convection in a gap between the shield unit and the processing container or radiation from the processing container. When plasma processing is performed, the temperature of the processing container can increase over time. For example, when plasma processing is performed on one wafer, a temperature of the processing container when processing ends becomes higher than a temperature of the processing container when processing starts. Also, when plasma processing is consecutively performed on a plurality of wafers, a temperature of the processing container when processing is performed on the plurality of wafers is higher than a temperature of the processing container when processing is performed on a first wafer. In this case, a temperature of the wafer can be changed over time or a plasma density of the plasma generating region can be changed over time. Accordingly, a rate of plasma processing or a degree of plasma processing may be changed over time during processing or for each processing. However, according to the present embodiment, the temperature of the processing container remains in the predetermined temperature by the controller 170. Therefore, it is possible to suppress a rate of plasma processing or a degree of plasma processing from being changed over time during processing or for each processing.

(c) According to the present embodiment, the gas buffer unit 182 is installed between the plasma generating unit and the gas exhaustion hole 185 within the gas flow path 140. A conductance in the gas buffer unit 182 is greater than a conductance of a space between the gas introduction hole 152a and the gas buffer unit 182. Therefore, when the temperature controlling gas is introduced into the gas buffer unit 182, it is difficult to interfere with a flow toward the gas exhaustion hole 185. The temperature controlling gas heated by the processing container 120 is efficiently exhausted from the gas buffer unit 182 to the gas exhaustion hole 185.

(d) According to the present embodiment, the plurality of intermediate openings 156 are installed between the plasma generating unit and the gas exhaustion hole 185 within the gas flow path 140, and are uniformly disposed in the circumferential direction of the processing container 120 within the gas flow path 140. The plurality of intermediate openings 156 are disposed from the gas exhaustion hole 185 at equal distances. A flow velocity at a part between the gas introduction hole 152a and the intermediate opening 156 within the gas flow path 140 is uniformized in the circumferential direction of the processing container 120. Therefore, the processing container 120 is likely to be uniformly cooled in the circumferential direction.

(e) According to the present embodiment, the gas guide 153 is installed between the processing container 120 and the resonant coil 132 of the plasma generating unit and guides the temperature controlling gas between the processing container 120 and the resonant coil 132 of the plasma generating unit through the gas introduction hole 152a. A part of the gas flow path 140 is installed between the processing container 120 and the gas guide 153. The gas flow path 140 becomes narrower at a part along the processing container 120 by the gas guide 153. Even when the temperature controlling gas has a similar flow rate, the temperature controlling gas flows at a high speed between the processing container 120 and the resonant coil 132. Since a heat transfer rate between the temperature controlling gas and the processing container 120 increases as a flow velocity of the temperature controlling gas increases, cooling of the processing container 120 is facilitated.

(f) According to the present embodiment, plasma processing is performed on the predetermined number of wafers 20, and the temperature controlling gas continuously flows in the gas flow path 140 until plasma processing is performed on the predetermined number of wafers 20. During the process, the temperature of the processing container 120 remains in the predetermined temperature. Plasma processing on each of the wafers 20 is performed while the temperature of the processing container 120 is the predetermined temperature. Therefore, it is possible to suppress a rate of plasma processing or a degree of plasma processing from being changed over time during processing or for each processing.

Here, as a method of stabilizing the temperature of the processing container 120, a case in which the processing container 120 is pre-heated before the plasma processing process or a case in which a cooling time is set when the processing container 120 is heated may be considered. However, in any case, an additional time is consumed. Throughput may decrease. However, according to the present embodiment, the temperature of the processing container 120 remains in the predetermined temperature. It is possible to suppress a rate of plasma processing or a degree of plasma processing from being changed over time during processing or for each processing. Therefore, productivity increases.

−Other Embodiments of the Present Invention

Embodiments of the present invention have been specifically described above. The present invention is not limited to the above-described embodiments, but may be variously changed without departing from the scope of the invention.

In the present embodiment, the object to be processed has been described as the wafer 20 before processing. The object to be processed may be a semiconductor device or a semiconductor package after processing.

In the present embodiment, a case in which the controller 170 serving as a control unit controls a flow rate of the temperature controlling gas by adjusting a degree of opening of the adjusting valve 184 based on temperature information from the temperature measurement unit 183 has been described. The controller 170 may control a flow rate of the temperature controlling gas based on a pre-input temperature simulation result. The controller 170 may control a flow rate of the temperature controlling gas based on a flow rate of the processing gas, power of the high frequency power source 144, a processing time and the number of processing times in addition to the simulation result.

In the present embodiment, a method in which the temperature measurement unit 183 is brought in direct contact with the processing container 120 to measure a temperature has been described. The temperature measurement unit 183 may measure a temperature of the temperature controlling gas flowing in the gas flow path 140. Also, the temperature measurement unit 183 may measure a temperature of the processing container 120 using an infrared thermometer in a non-contact manner.

In the present embodiment, a case in which the plurality of intermediate openings 156 of the gas flow path 140 are installed in an annular shape has been described. The intermediate opening 156 may be a gap having an annular shape (ring shape). The intermediate opening 156 is preferably disposed concentrically with the processing container 120. The gas exhaustion hole 185 is disposed at the center of the intermediate opening 156 having an annular shape in a birds-eye view of the plasma processing apparatus 10. Therefore, the same effects as in the present embodiment may be obtained.

According to the plasma processing apparatus and the method of manufacturing a semiconductor device of the present invention, it is possible to increase uniformity of plasma processing in a surface to be processed of an object to be processed or increase uniformity of plasma processing between objects to be processed.

PREFERRED EMBODIMENTS OF THE PRESENT INVENTION

Hereinafter, preferred embodiments according to the present invention are supplementarily noted.

<Supplementary Note 1>

According to an aspect of the present invention, there is provided a plasma processing apparatus including:

a processing container configured to accommodate an object to be processed;

a gas supply system configured to supply a processing gas into the processing container;

an exhaust system configured to exhaust an inside atmosphere of the processing container;

a plasma generating unit installed outside the processing container and configured to generate a plasma of the processing gas supplied into the processing container;

a gas flow path installed at least between an outer wall of the processing container and the plasma generating unit, the gas flow path guiding a temperature controlling gas to flow along the outer wall of the processing container;

a plurality of gas introduction holes disposed along a circumferential direction of the processing container and configured to introduce the temperature controlling gas into the gas flow path; and a gas exhaustion hole configured to exhaust the temperature controlling gas passed through the gas flow path.

<Supplementary Note 2>

In the plasma processing apparatus of Supplementary note 1, preferably, further including:

a gas exhaustion pipe connected to the gas exhaustion hole and configured to exhaust the temperature controlling gas through the gas exhaustion hole;

an adjusting valve installed at the gas exhaustion pipe; and a control unit configured to control a flow rate of the temperature controlling gas by adjusting an opening degree of the adjusting valve.

<Supplementary Note 3>

According to another aspect of the present invention, there is provided a plasma processing apparatus including:

a processing container configured to accommodate an object to be processed;

a gas supply system configured to supply a processing gas into the processing container;

an exhaust system configured to exhaust an inside atmosphere of the processing container;

a plasma generating unit installed outside the processing container and configured to generate a plasma of the processing gas supplied into the processing container;

a gas flow path installed between an outer wall of the processing container and the plasma generating unit, the gas flow path guiding a temperature controlling gas to flow along the outer wall of the processing container;

a gas introduction hole configured to introduce the temperature controlling gas into the gas flow path;

a gas exhaustion hole configured to exhaust the temperature controlling gas passed through the gas flow path;

a gas exhaustion pipe connected to the gas exhaustion hole and configured to exhaust the temperature controlling gas through the gas exhaustion hole;

an adjusting valve installed at the gas exhaustion pipe; and a control unit configured to control a flow rate of the temperature controlling gas by adjusting an opening degree of the adjusting valve.

<Supplementary Note 4>

In the plasma processing apparatus of any one of Supplementary notes 2 and 3, preferably, further including a temperature measurement unit configured to measure a temperature of the processing container, and the control unit is further configured to control the adjusting valve based on a temperature information generated by the temperature measurement unit.

<Supplementary Note 5>

In the plasma processing apparatus of any one of Supplementary notes 1 through 4, preferably, further including a gas buffer unit installed between the plasma generating unit and the gas exhaustion hole, and a conductance of the gas buffer unit is greater than that of a space between the plurality of gas introduction holes and the gas buffer unit.

<Supplementary Note 6>

In the plasma processing apparatus of Supplementary note 5, preferably, the gas buffer unit is disposed on the processing container.

<Supplementary Note 7>

In the plasma processing apparatus of any one of Supplementary notes 5 and 6, preferably, the gas exhaustion hole is installed at the center of the gas buffer unit in a birds-eye view.

<Supplementary Note 8>

The plasma processing apparatus of any one of Supplementary notes 1 to 7, preferably, further includes a plurality of intermediate openings that are installed between the plasma generating unit and the gas exhaustion hole and are uniformly disposed in a circumferential direction of the processing container within the gas flow path, and the plurality of intermediate openings are disposed from the gas exhaustion hole at uniform distances.

<Supplementary Note 9>

The plasma processing apparatus of any one of Supplementary notes 1 to 8, preferably, further includes a shield unit that is installed to surround an outside of the plasma generating unit, includes the gas introduction hole and has conductivity, and a part of the gas flow path is installed at least between the processing container and the shield unit.

<Supplementary Note 10>

In the plasma processing apparatus of any one of Supplementary notes 1 through 9, preferably, further including a gas guide disposed between the processing container and the plasma generating unit to surround the outer wall of the processing container wherein the gas guide is configured to guide the temperature controlling gas introduced through the plurality of gas introduction holes to flow between the processing container and the plasma generating unit, and wherein the gas flow path is installed between the processing container and the gas guide unit.

<Supplementary Note 11>

In the plasma processing apparatus of any one of Supplementary note 10, preferably, the gas guide is formed of a material having a low dielectric constant.

<Supplementary Note 12>

In the plasma processing apparatus of any one of Supplementary notes 10 and 11, preferably, the gas guide is formed of an insulating material.

<Supplementary Note 13>

In the plasma processing apparatus of any one of Supplementary notes 10 through 12, preferably, the gas guide is formed of a material having heat resistance.

<Supplementary Note 14>

The plasma processing apparatus of any one of Supplementary notes 10 to 13, preferably, further includes a shield unit that is installed to surround an outside of the plasma generating unit, includes the gas introduction hole and has conductivity, and an interval between the gas guide and the processing container is smaller than an interval between the gas guide and the shield unit.

<Supplementary Note 15>

In the plasma processing apparatus of any one of Supplementary notes 10 to 14, preferably, the gas guide includes an intermediate portion installed to surround the processing container; and a flange unit that comes in contact with the gas introduction hole side within the intermediate portion and is installed to suppress the temperature controlling gas from being introduced between the gas guide and the shield unit.

<Supplementary Note 16>

In the plasma processing apparatus of Supplementary note 15, preferably, the flange unit extends to the outside from the intermediate portion in a diameter direction.

<Supplementary Note 17>

In the plasma processing apparatus of any one of Supplementary notes 10 through 16, preferably, the gas guide is formed of one of a material selected from the group consisting of Teflon (registered trademark), PTFE (polytetrafluoroethylene), PCTFE (polychlorotrifluoroethylene), PEEK (Polyether ether ketone), POM (polyoxymethylene), Vespel (registered trademark) and PBI (polybenzimidazole).

<Supplementary Note 18>

In the plasma processing apparatus of any one of Supplementary notes 1 through 17, preferably, the temperature controlling gas includes at least one of an air and a nitrogen gas.

<Supplementary Note 19>

In the plasma processing apparatus of any one of Supplementary notes 1 through 18, preferably, the plurality of gas introduction holes are disposed along the circumferential direction of the processing container at equal intervals.

<Supplementary Note 20>

According to another aspect of the present invention, there is provided a method of manufacturing a semiconductor device, including:

(a) loading an object to be processed into a processing container;

(b) introducing a processing gas into the processing container, generating plasma of the processing gas supplied into the processing container using the plasma generating unit installed outside the processing container, and subjecting the object to a plasma processing; and (c) introducing a temperature controlling gas into a gas flow path through a plurality of gas introduction holes disposed along a circumferential direction of the processing container, wherein the gas flow path is installed at least between an outer wall of the processing container and the plasma generating unit along the outer wall of the processing container.

<Supplementary Note 21>

According to still another aspect of the present invention, there is provided a method of manufacturing a semiconductor device, including:

(a) loading an object to be processed into a processing container;

(b) introducing a processing gas into the processing container and generating plasma of the processing gas supplied into the processing container using the plasma generating unit installed outside the processing container, and subjecting the object to a plasma processing; and (c) introducing a temperature controlling gas into a gas flow path installed at least between an outer wall of the processing container and the plasma generating unit along the outer wall of the processing container and controlling a flow rate of the temperature controlling gas such that the processing container is at a predetermined temperature.

<Supplementary Note 22>

In the method of manufacturing a semiconductor device of any one of Supplementary notes 20 and 21, preferably, (b) is performed to a predetermined number of objects to be processed and (c) is performed while performing (b) to the predetermined number of the objects to be processed.

<Supplementary Note 23>

In the method of manufacturing a semiconductor device of any one of Supplementary notes 20 through 22, preferably, the temperature controlling gas is introduced into the gas flow path through the plurality of gas introduction holes disposed along the circumferential direction of the processing container at equal intervals.

According to the substrate processing apparatus and the method of manufacturing a semiconductor device of the present invention, it is possible to increase uniformity of plasma processing in a surface to be processed of an object to be processed or increase uniformity of plasma processing between objects to be processed.

What is claimed is:
1. A plasma processing apparatus comprising:
a reaction tube in which a plasma generating region is formed;
a processing chamber communicating with the plasma generating region and configured to accommodate an object to be processed;
a gas supply system configured to supply a processing gas into the reaction tube;
an exhaust system configured to exhaust an inside atmosphere of the processing chamber;

a plasma generating unit installed along an outer periphery of the reaction tube and configured to generate a plasma of the processing gas supplied into the reaction tube;

a gas flow path installed between the reaction tube and the plasma generating unit, the gas flow path guiding a temperature controlling gas to flow along an outer wall of the reaction tube;

a plurality of gas introduction holes disposed at a lower portion of the plasma generating unit along a circumferential direction of the reaction tube at equal intervals and configured to introduce the temperature controlling gas into the gas flow path;

a plurality of openings configured as a part of the gas flow path and disposed above the plasma generating unit in a manner that the plurality of openings are arranged outside an upper end of the reaction tube at equal intervals so as to surround the reaction tube, wherein the temperature controlling gas flowing along the outer wall of the reaction tube passes through the plurality of openings;

a gas exhaustion hole configured to exhaust the temperature controlling gas passed through the gas flow path via the plurality of openings; and a gas buffer unit installed vertically above the reaction tube between the plurality of openings and the gas exhaustion hole without a space between the upper end of the reaction tube and the gas buffer unit, wherein all of the plurality of openings are connected to the gas buffer unit.

2. The plasma processing apparatus of claim 1, further comprising:

a gas exhaustion pipe connected to the gas exhaustion hole and configured to exhaust the temperature controlling gas through the gas exhaustion hole;

an adjusting valve installed at the gas exhaustion pipe and configured to control a flow rate of the temperature controlling gas; and a control unit configured to control the flow rate of the temperature controlling gas by adjusting an opening degree of the adjusting valve so that a temperature of the reaction tube reaches a predetermined temperature.

3. The plasma processing apparatus of claim 2, further comprising a temperature measurement unit configured to measure a temperature of the processing chamber, wherein the control unit is further configured to control the adjusting valve based on a temperature information generated by the temperature measurement unit.

4. The plasma processing apparatus of claim 1, wherein the gas exhaustion hole is installed at a center of the plurality of openings having annular shape when viewed from vertically above the reaction tube.

5. The plasma processing apparatus of claim 1, further comprising a shield unit having conductivity and installed to surround an outside of the plasma generating unit, wherein the plurality of gas introduction holes are provided at the shield unit, and a part of the gas flow path is installed at least between the reaction tube and the shield unit.

6. The plasma processing apparatus of claim 1, further comprising a gas guide disposed between the reaction tube and the plasma generating unit to surround the outer wall of the reaction tube, wherein the gas guide is configured to guide the temperature controlling gas introduced through the plurality of gas introduction holes to flow between the reaction tube and the plasma generating unit toward the plurality of openings, and wherein the gas flow path is installed between the reaction tube and the gas guide.

7. The plasma processing apparatus of claim 6, wherein the gas guide is formed of an insulating material.

8. The plasma processing apparatus of claim 6, further comprising a shield unit having conductivity and installed to surround an outside of the plasma generating unit, wherein the plurality of gas introduction holes are provided at the shield unit, and wherein an interval between the gas guide and the outer wall of the reaction tube is smaller than an interval between the gas guide and the shield unit.

9. The plasma processing apparatus of claim 1, wherein the plasma generating unit comprises a coil wound along the outer wall of the reaction tube.

10. The plasma processing apparatus of claim 1, wherein the plurality of openings vertically overlap the plurality of gas introduction holes.

* * * * *